United States Patent
Maurino et al.

(10) Patent No.: US 8,766,836 B2
(45) Date of Patent: Jul. 1, 2014

(54) SIGMA DELTA MODULATOR WITH DITHER

(71) Applicants: Roberto S. Maurino, Turin (IT); Colin G. Lyden, Torino (IE)

(72) Inventors: Roberto S. Maurino, Turin (IT); Colin G. Lyden, Torino (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/715,005

(22) Filed: Dec. 14, 2012

(65) Prior Publication Data
US 2013/0207820 A1 Aug. 15, 2013

Related U.S. Application Data

(60) Provisional application No. 61/597,422, filed on Feb. 10, 2012.

(51) Int. Cl.
*H03M 3/00* (2006.01)
(52) U.S. Cl.
CPC .......... *H03M 3/30* (2013.01); *H03M 3/422* (2013.01)
USPC .......................................... 341/143; 341/131
(58) Field of Classification Search
CPC .............................. H03M 3/30; H03M 3/422
USPC .................................................. 341/143, 131
See application file for complete search history.

(56) References Cited

U.S. PATENT DOCUMENTS

| | | | | |
|---|---|---|---|---|
| 4,812,846 | A | * | 3/1989 | Noro ............................ 341/131 |
| 5,073,778 | A | | 12/1991 | Ueki et al. |
| 5,329,282 | A | | 7/1994 | Jackson |
| 5,990,815 | A | * | 11/1999 | Linder et al. ................... 341/131 |
| 6,480,528 | B1 | * | 11/2002 | Patel et al. ..................... 375/148 |
| 6,825,784 | B1 | * | 11/2004 | Zhang ........................... 341/131 |
| 7,411,534 | B1 | * | 8/2008 | Melanson ...................... 341/131 |
| 7,868,798 | B2 | * | 1/2011 | Azadet et al. ................. 341/131 |
| 2005/0007267 | A1 | | 1/2005 | Zogakis et al. |
| 2007/0252737 | A1 | | 11/2007 | Eikenbroek |
| 2010/0245136 | A1 | | 9/2010 | Azadet et al. |

FOREIGN PATENT DOCUMENTS

EP 2381578 A1 * 10/2011

OTHER PUBLICATIONS

Kuo et al., "Multi-bit Delta-Sigma Modulator Using a Modified DWA Algorithm.", in: Analog Integrated Circuits an Signal Processing, vol. 33, Dec. 2002, pp. 289-300 [online] retrieved on Mar. 21, 2013 from http://tzyweihsueh.sg1010.myweb.hinet.net/aic02_dec.pdf, entire document, especially Fig. 4(b), 6; p. 295, col. 1, para 1.

(Continued)

*Primary Examiner* — Brian Young
(74) *Attorney, Agent, or Firm* — Kenyon & Kenyon, LLP

(57) ABSTRACT

A sigma delta modulator may include a loop filter and an adder configured to accept an output of the loop filter and a dither input signal. The adder may be further configured to combine the output of the loop filter and the dither input signal into a combined output signal. The sigma delta modulator may further include a quantizer configured to accept the combined output signal from the adder, and quantize the combined signal into a quantizer output signal. The sigma delta modulator may further include a first subtractor configured to accept the quantizer output signal and subtract the dither input signal from the quantizer output signal.

24 Claims, 11 Drawing Sheets

(56) References Cited

OTHER PUBLICATIONS

Hussein, "Design and Analysis of Fractional-N Frequency Synthesizers for Wireless Communications.", [online], dated Dec. 2002, retrieved on Mar. 21, 2013, from http://faculty.kfupm.edu.sa/ee/hussein/files/Phd_Thesis.pdf, especially abstract; p. 18, last para.

Dunn et al., "A Comparison of Dithered and Chaotic Sigma-Delta Modulators.", in Journal of the Engineering Audio Society, vol. 44, No. 4, Apr. 1996, pp. 227-244 [online], retrieved on Mar. 21, 2013, from http://www.scalatech.co.uk/papers/jaes496.pdf, entire document.

International Search Report and Written Opinion issued on Apr. 24, 2013, for the counterpart International Application No. PCT/US2013/025340.

Matsuya et al., "A 16-bit Oversampling A-to-D Conversion Technology Using Triple-Integration Noise Shaping," IEEE Journal of Solid-State Circuits, vol. 22, No. 6, pp. 921-929, Dec. 1987.

\* cited by examiner

SIGMA DELTA MODULATOR WITH DITHER

PRIORITY CLAIM

The present application claims priority to U.S. Provisional Application No. 61/597,422, filed on Feb. 10, 2012, the entirety of which is incorporated by reference herein.

BACKGROUND

The present invention relates to an improved sigma delta modulator. Sigma delta modulators operating at low input values or with DC inputs may suffer from tonal behavior. For example, the output spectrum may show large tones resulting in a degradation in signal-noise ratio (SNR). Dither, which is an intentionally applied form of noise, may be introduced to break such tones. However, the introduction of dither may require a loop filter with additional headroom.

As illustrated in FIG. 1, dither 110 may typically be added in front of a quantizer 130 in a conventional sigma delta modulator. In this manner, the dither noise is shaped by the loop filter 120 and at the output of the modulator 100, there will be little dither power in the signal bandwidth. In this case, however, dither will be added to the feedback loop, also requiring additional headroom in the loop filter 120. For example, in the case of sigma delta modulators with a signal transfer function of unity, the loop filter 120 may only process the quantizer error. If the dither is added to the quantizer input, dither adds directly to the quantizer error requiring increased headroom for the loop filter 120. Increased headroom typically leads to higher power consumption. At low power supplies, power efficient telescopic operational transconductance amplifiers (OTA) may not be used in the loop filter 120. Thus, a two stage amplifier, which requires additional power, may be required to accommodate the larger output swing.

DETAILED DESCRIPTION

Embodiments of the present invention provide a sigma delta modulator with dither. Embodiments of the present invention may remove the requirement of additional headroom in a loop filter when introducing dither into a sigma delta modulator. Embodiments of the present invention may introduce dither at the input of a quantizer, but then remove it at the output of the quantizer. In this manner, the increased power requirements associated with adding dither and additional headroom may be avoided.

Embodiments of the present invention may provide shaped dither, using a first order digital processing stage, for example. Shaping the dither may allow accuracy requirements for dither DACs to be relaxed. Further, using first order shaped dither allows a filter DAC to add unshaped dither at the output of the first integrator. In this manner, increases to the headroom of the loop filter may be avoided, increasing the power efficiency of the sigma delta modulator.

Figure 1:
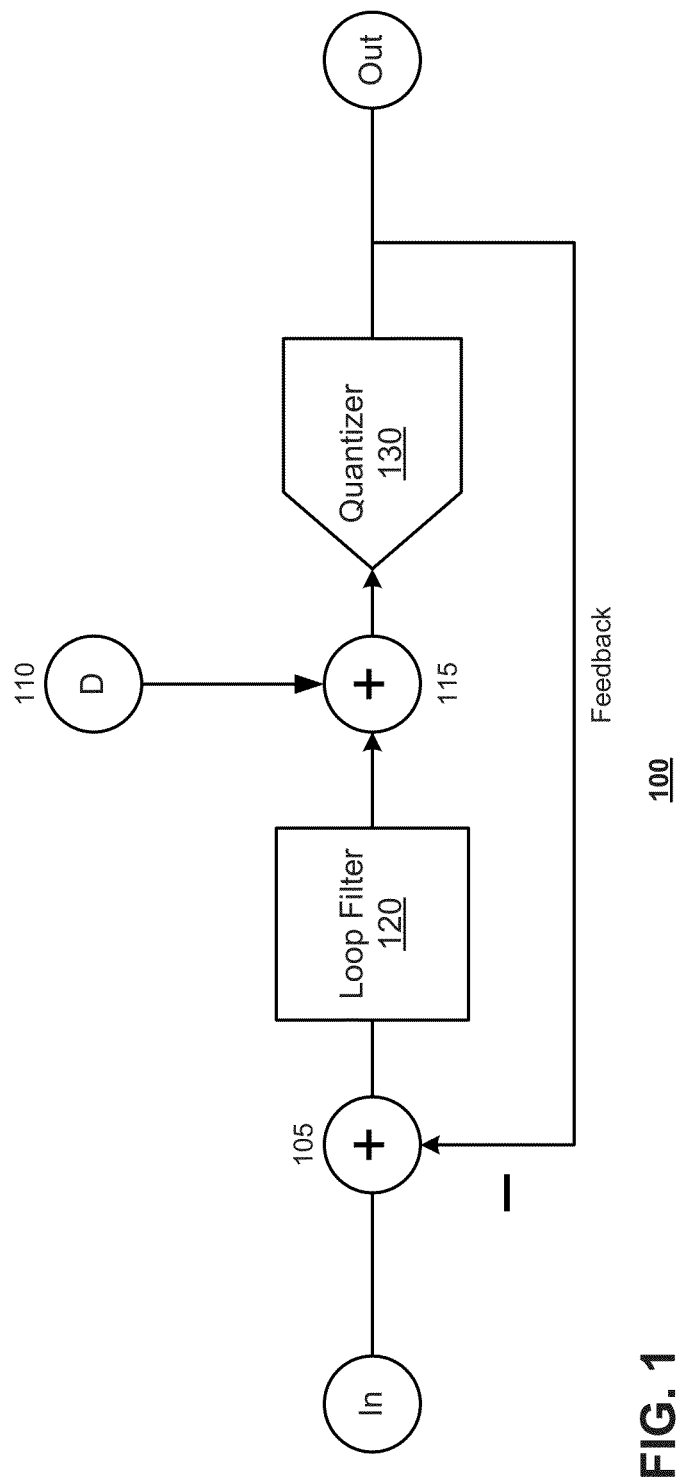
FIG. 1 illustrates a conventional sigma delta modulator.
Figure 2:
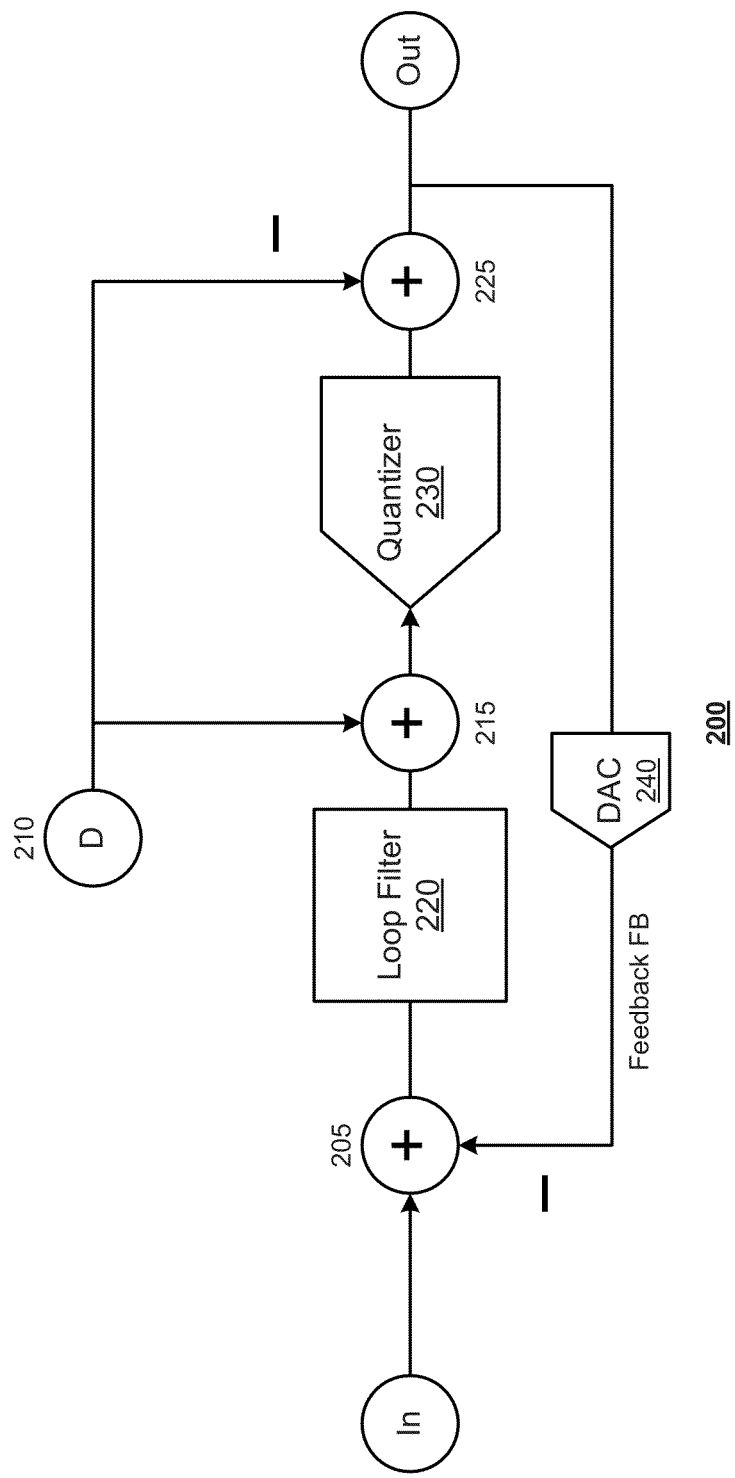
FIG. 2 illustrates a sigma delta modulator according to an embodiment of the present invention.

FIG. 2 illustrates a sigma delta modulator 200 according to an embodiment of the present invention. The sigma delta modulator 200 may include a first subtractor 205, a dither source 210, an adder 215, a loop filter 220, a second subtractor 225, a quantizer 230 and a digital to analog converter (DAC) 240 provided in the feedback path. The first subtractor 205 may have inputs for an input signal IN and a feedback signal provided by the DAC 240 and may have an output for a signal representing a difference between the input signal IN and the feedback signal. The DAC 240 may convert an output signal OUT from the modulator 200 to an analog representation, which may become the feedback signal to the first subtractor 205. Thus, the output of the first subtractor 205 may represent a difference between the input signal IN and the output signal OUT. The loop filter 220 may be a low-pass filter that filters the difference signal provided by the first subtractor 205. In an alternative embodiment, the loop filter 220 may be a band pass filter, or high pass filter.

The dither source 210 may introduce a dither signal to the modulator 200, which may be an intentionally applied form of noise. The dither signal may be applied to an output of the loop filter 220 via the adder 215. In an embodiment, the dither signal may be shaped as will be discussed further with respect to FIGS. 4 and 5.

The quantizer 230 may quantize the input signal and output it to the second subtractor 225. The second subtractor 225 may subtract the dither signal from the output of the quantizer 230. In an embodiment, the quantizer 230 may be a scalar or rounding quantizer. The output of the second subtractor 225 may be output from the system 200 as the system's output signal OUT.

As noted, the DAC 240 may be provided in the feedback path of the modulator 200. The DAC 240 may convert the output signal OUT to an analog representation, which may be input to the subtractor 205.

As discussed above, the dither signal may be introduced at adder 215 and removed at the subtractor 225. In this manner, dither may be used by the quantizer 230 to break potential tonal behavior that otherwise might occur due to quantization noise produced by the quantizer 230. At the same time, since the dither is removed by the subtractor 225, the dither does not require additional headroom to be provided within the loop filter 220 to accommodate the dither signal. Thus, by introducing the dither signal at a point after the loop filter 220 but before the quantizer 230 and, further, by removing the dither signal immediately before the dither signal is input to the loop filter 220, the embodiment of FIG. 2 provides a straightforward and low cost solution to the headroom problems typically associated with adding dither.

Figure 3:
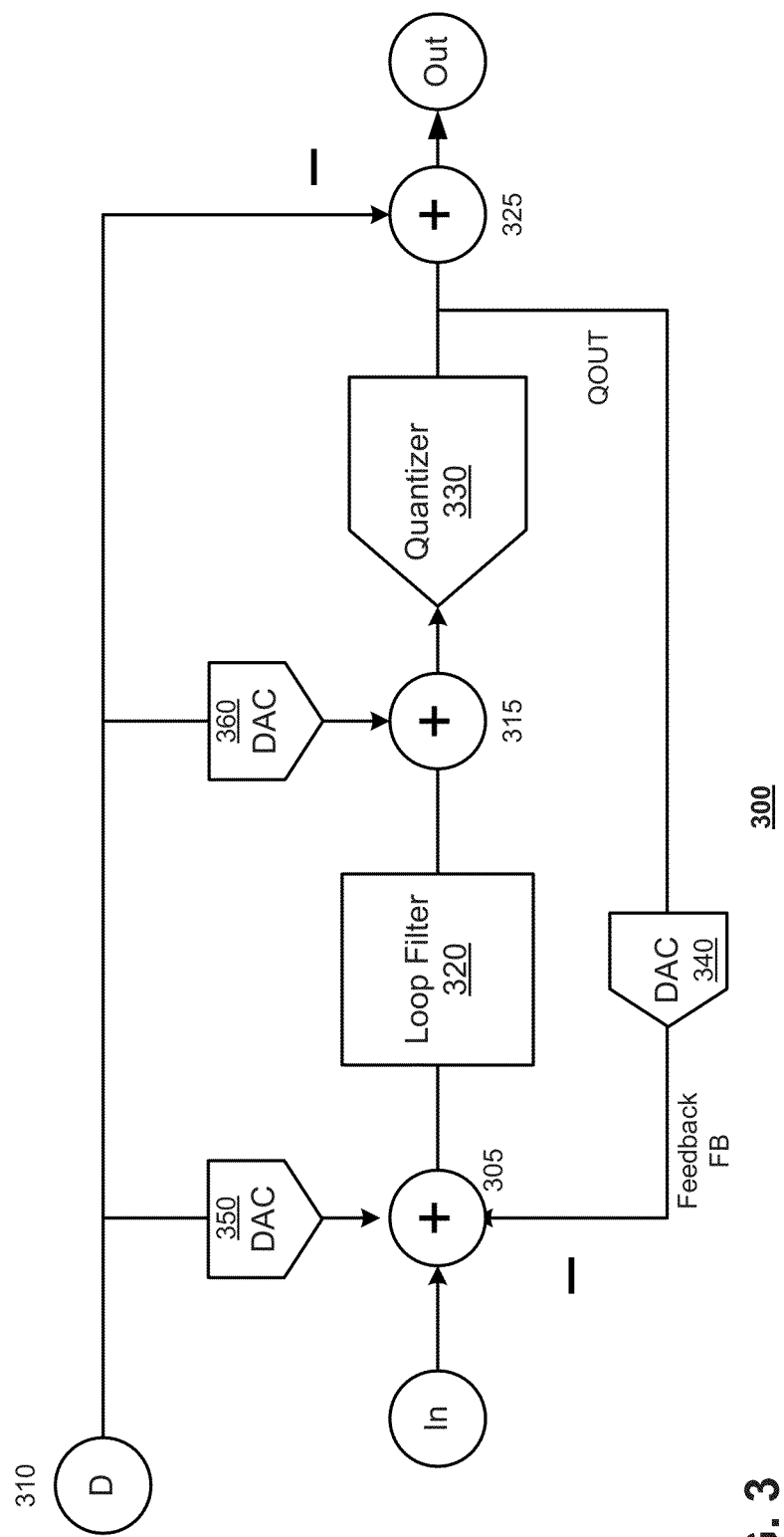
FIG. 3 illustrates a sigma delta modulator according to an embodiment of the present invention.

FIG. 3 illustrates a sigma delta modulator 300 according to another embodiment of the present invention. The sigma delta modulator 300 may include a first subtractor 305, a dither source 310, an adder 315, a loop filter 320, a second subtractor 325, a quantizer 330, and a variety of DACs 340-360. The modulator 300 may accept an input signal IN at an input of the first subtractor 305 and may generate an output signal OUT at an output terminal of the second subtractor 325.

In the embodiment illustrated in FIG. 3, the dither source 310 may generate a dither signal that is input to the modulator 300 as a digital signal. The DACs 350 and 360 may generate analog representations of the dither signal, which may be input respectively to the subtractor 305 and the adder 315. Again, in an embodiment, the dither may be shaped as discussed further with respect to FIGS. 4 and 5.

The first subtractor 305 may have inputs for the input signal IN, an analog representation of the dither signal D and a feedback signal FB generated by a DAC 340 in a feedback path of the modulator 300. The first subtractor 305 may generate an output that represents a difference between the input signal and the quantizer output signal QOUT with dither subtracted (e.g., $\Delta IN=IN-(QOUT-D)$). Note that OUT=QOUT-D, So effectively, $\Delta IN=IN-OUT$. The output signal $\Delta IN$ from the first subtractor 305 may be input to the loop filter 320. The loop filter 320 may be a low-pass filter, band pass filter, or high pass filter.

The output of the loop filter 320 may be input to the adder 315, along with an analog representation of the dither signal. The adder 315 may add the dither signal into the loop filter's output, which may be input to the quantizer 330. The quantizer 330 may generate a digital representation of the signal input to it and output the signal to subtractor 325. Therefore, the output of the quantizer 330 may include a dither component, which may reduce tonal behavior in the quantizer's output.

The second subtractor 325 may subtract the dither signal D from the output of the quantizer 330, which effectively cancels the dither component in the output of the quantizer 330. An output of the second subtractor 325 may be output from the modulator 300 as the output signal OUT.

In the embodiment illustrated in FIG. 3, the DAC 340 in the feedback path takes its input from the output for the quantizer 330, which as noted, includes a dither component. The DAC 340 may generate an analog representation of the digital signal presented to it and, therefore, may generate a feedback signal. The quantizer 330 may be a scalar or rounding quantizer used to perform quantization on an input signal. The quantizer 330 may be situated between adder 315 and subtractor 325.

In the embodiment illustrated in FIG. 3, the introduction of dither after the loop filter 320 at adder 315 (and removal of the dither at subtractors 325 and 305 through DAC 350) may obviate the need for additional headroom to compensate for the dither at loop filter 320. Since dither is canceled prior to reaching the loop filter 320, no additional headroom may be needed at the loop filter 320 due to the introduction of dither. In addition, the dither DAC 350 is used to remove dither from the feedback loop. In this manner, dither may be used by the quantizer 330 to break potential tonal behavior exhibited due to quantization noise produced by the quantizer 330 without adding additional headroom to compensate for the dither at the loop filter 320.

Figure 4A:
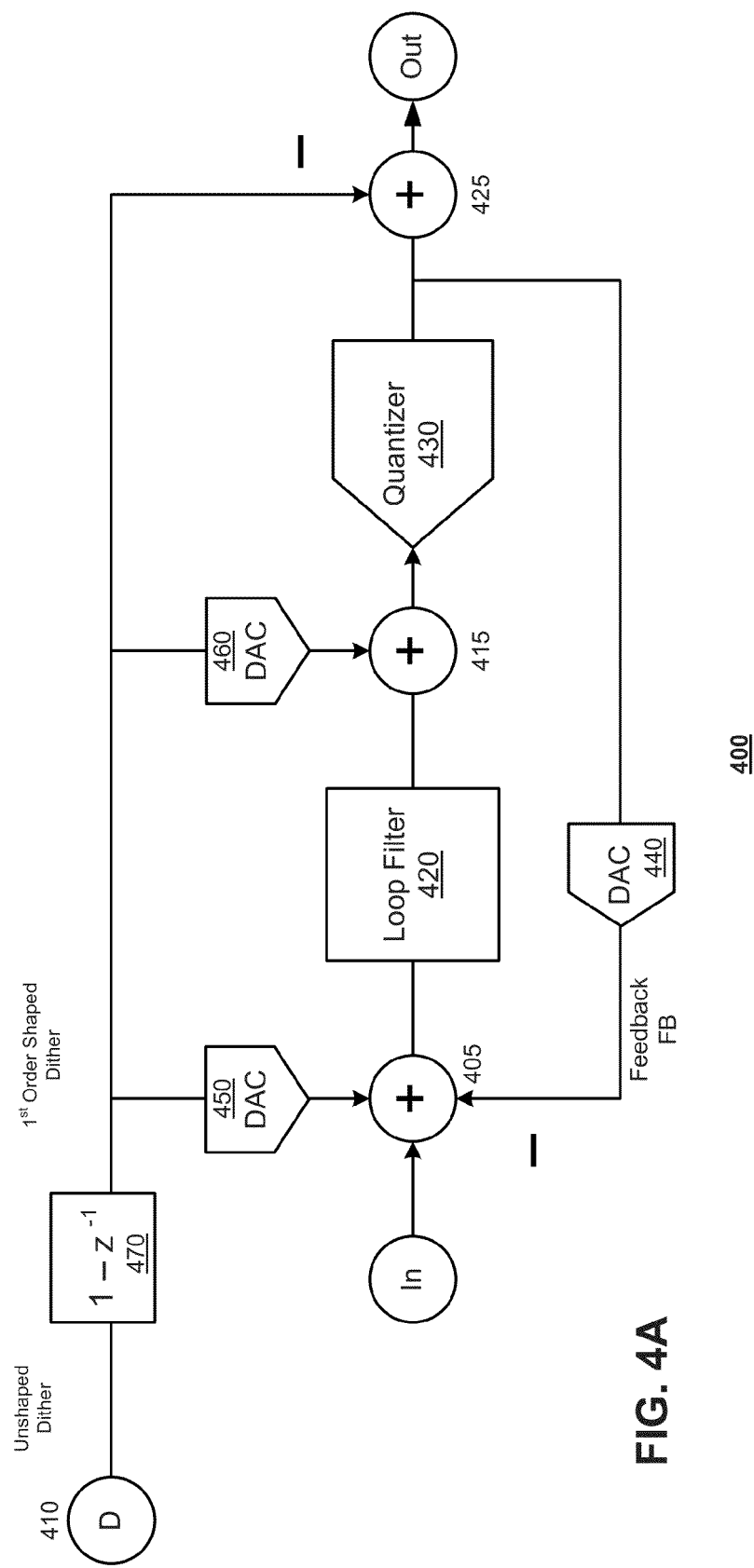
FIG. 4A illustrates a sigma delta modulator according to an embodiment of the present invention.

FIG. 4A is a sigma delta modulator 400 according to another embodiment of the present invention. The sigma delta modulator 400 may include a first subtractor 405, a dither source 410, an adder 415, a loop filter 420, a second subtractor 425, a quantizer 430, a variety of DACs 440-460, and a shaping unit 470. The modulator 400 may accept an input signal IN at an input of the first subtractor 405 and may generate an output signal OUT at an output terminal of the second subtractor 425.

In the embodiment illustrated in FIG. 4A, the dither source 410 may generate a dither signal that is input to the modulator 400 as a digital signal. The DACs 450 and 460 may generate analog representations of the dither signal, which may be input respectively to the subtractor 405 and the adder 415. Again, in an embodiment, the dither may be shaped, for example, by shaping unit 470. Shaping unit 470 may be a digital process stage filter that shapes the dither according to a function, such as $1-z^{-1}$. In this manner, the accuracy of dither DACs 450 and 460 may be relaxed while still sufficiently canceling dither prior to the input of loop filter 420.

The first subtractor 405 may have inputs for the input signal IN, an analog representation of the shaped dither signal D and a feedback signal FB generated by a DAC 440 in a feedback path of the modulator 400. The first subtractor may generate an output that represents a difference between the input signal and the quantizer output signal QOUT with shaped dither subtracted (e.g., $\Delta IN=IN-(QOUT-D(1-z^{-1}))$). Again, note that $\Delta IN=IN-OUT$. The output signal $\Delta IN$ from the first subtractor 405 may be input to the loop filter 420. The loop filter 420 may be a low-pass filter, band pass filter, or high pass filter. Different dither shaping function may be required depending on the type of loop filter. A low-pass loop filter may require a high pass dither shaping function, such has $1-z^{-1}$. A band pass loop filter may require a band stop dither shaping function. A high pass loop filter may require a low pass dither shaping function.

The output of the loop filter 420 may be input to the adder 415, along with an analog representation of the shaped dither signal. The adder 415 may add the shaped dither signal into the loop filter's output, which may be input to the quantizer 430. The quantizer 430 may generate a digital representation of the signal input to it and may output the signal to subtractor 425. Therefore, the output of the quantizer 430 includes a dither component.

The second subtractor 425 may subtract the shaped dither signal D $(1-z^{-1})$ from the output of the quantizer 430, which effectively cancels the dither component in the output of the quantizer. An output of the second subtractor 425 may be output from the modulator 400 as the output signal OUT.

In the embodiment illustrated in FIG. 4A, the DAC 440 in the feedback path takes its input from the output for the quantizer 430, which as noted, includes a shaped dither component. The DAC 440 may generate an analog representation of the digital signal presented to it and, therefore, may generate a feedback signal. The quantizer 430 may be a scalar or rounding quantizer used to perform quantization on an input signal. The quantizer 430 may be situated between adder 415 and subtractor 425.

In the embodiment illustrated in FIG. 4A, the introduction of shaped dither after the loop filter 420 at adder 415 (and removal of the shaped dither at subtractors 425 and 405 through DAC 450) may obviate the need for additional headroom to compensate for the shaped dither at loop filter 420. Since dither is canceled prior to reaching the loop filter 420, no additional headroom may be needed at the loop filter 420 due to the introduction of dither. In addition, the dither DAC 450 is used to remove dither from the feedback loop. In this manner, dither may be used by the quantizer 430 to break potential tonal behavior exhibited due to quantization noise produced by the quantizer 430 without adding additional headroom to compensate for the dither at the loop filter 420.

Figure 4B:
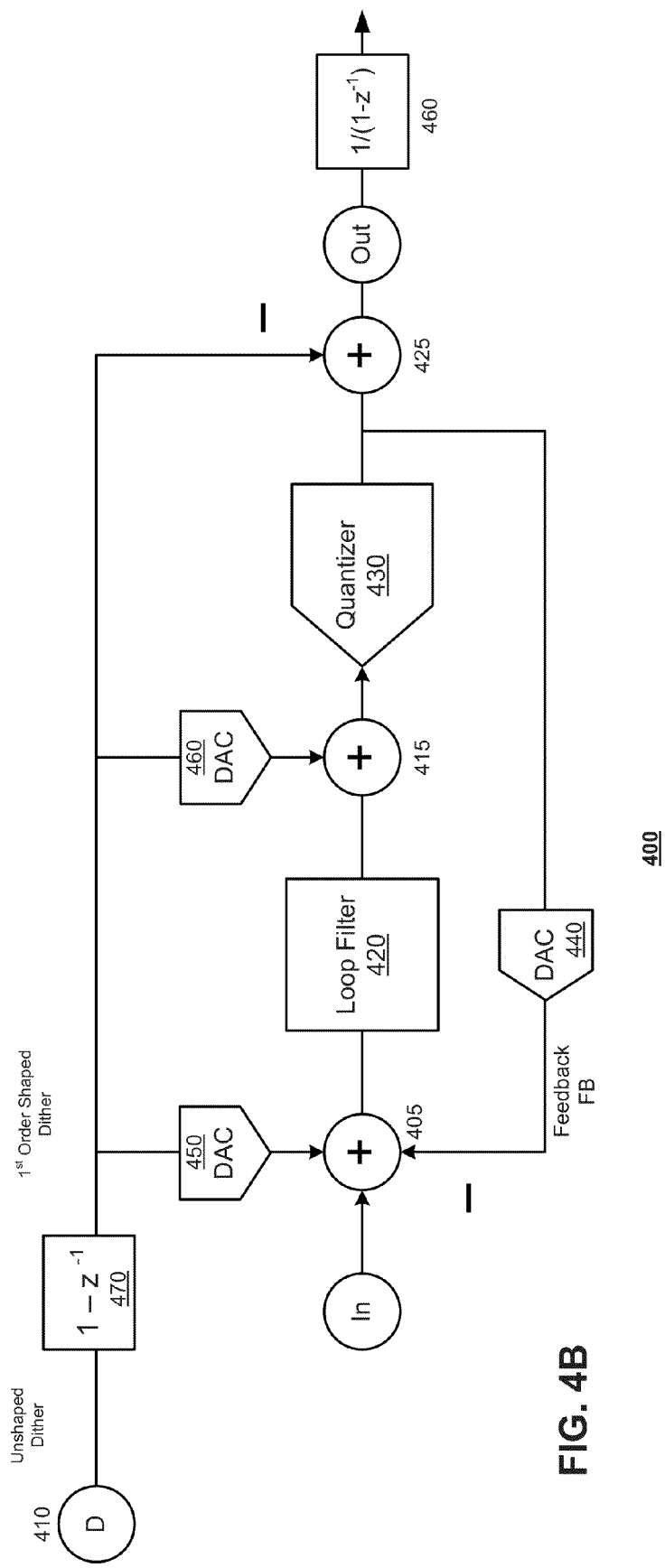
FIG. 4B illustrates a sigma delta modulator according to an embodiment of the present invention.
Figure 4C:
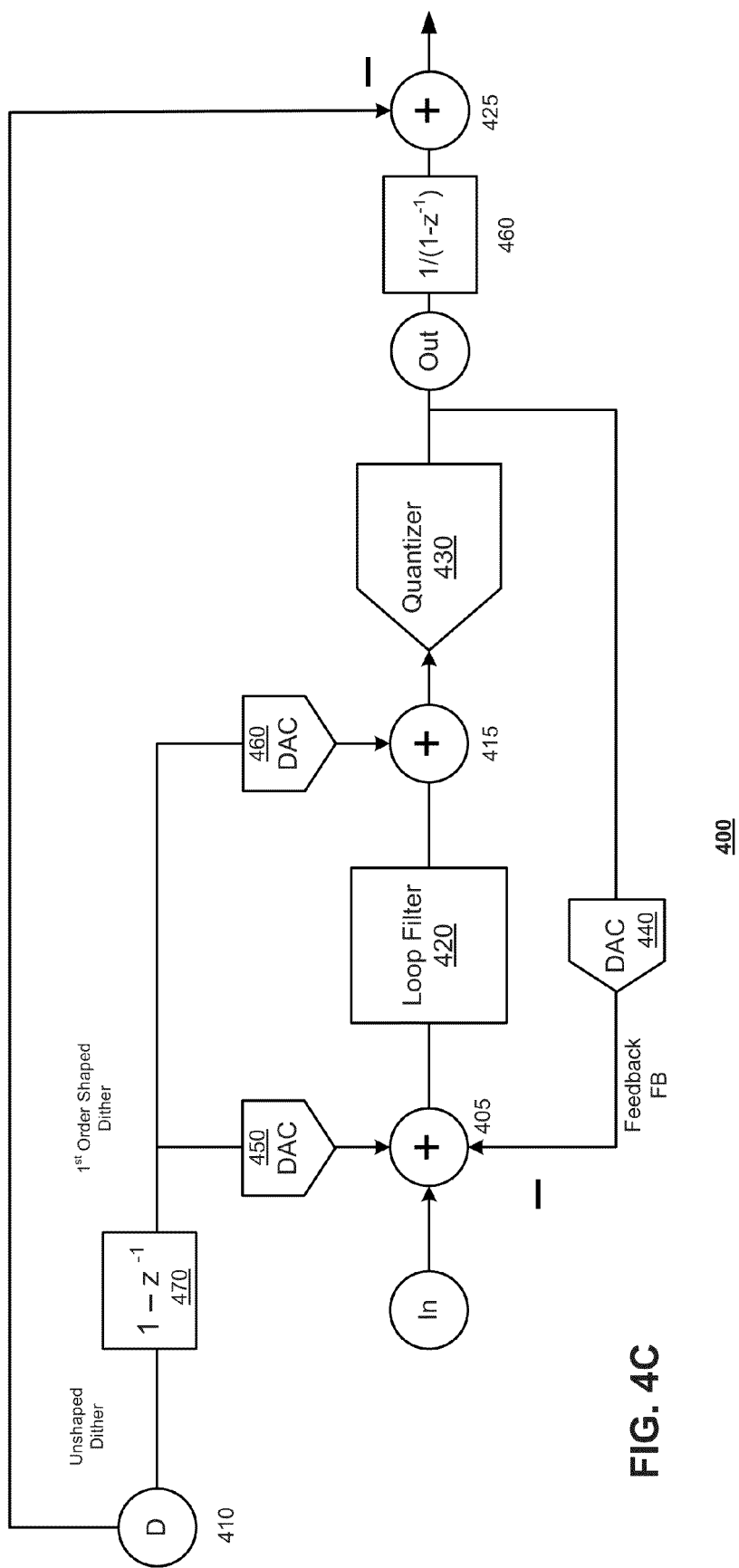
FIG. 4C illustrates a sigma delta modulator according to an embodiment of the present invention.

FIG. 4B illustrates an embodiment for sigma delta modulator 400. FIG. 4B illustrates an embodiment in which a first stage of a decimation filter 460, which may be an integrator, is used. In this embodiment, subtractor 425 is located at the output of quantizer 430. As illustrated within another embodiment of FIG. 4C, subtractor 425 may be included within a decimation filter, including first stage of the decimation filter 460.

Figure 5:
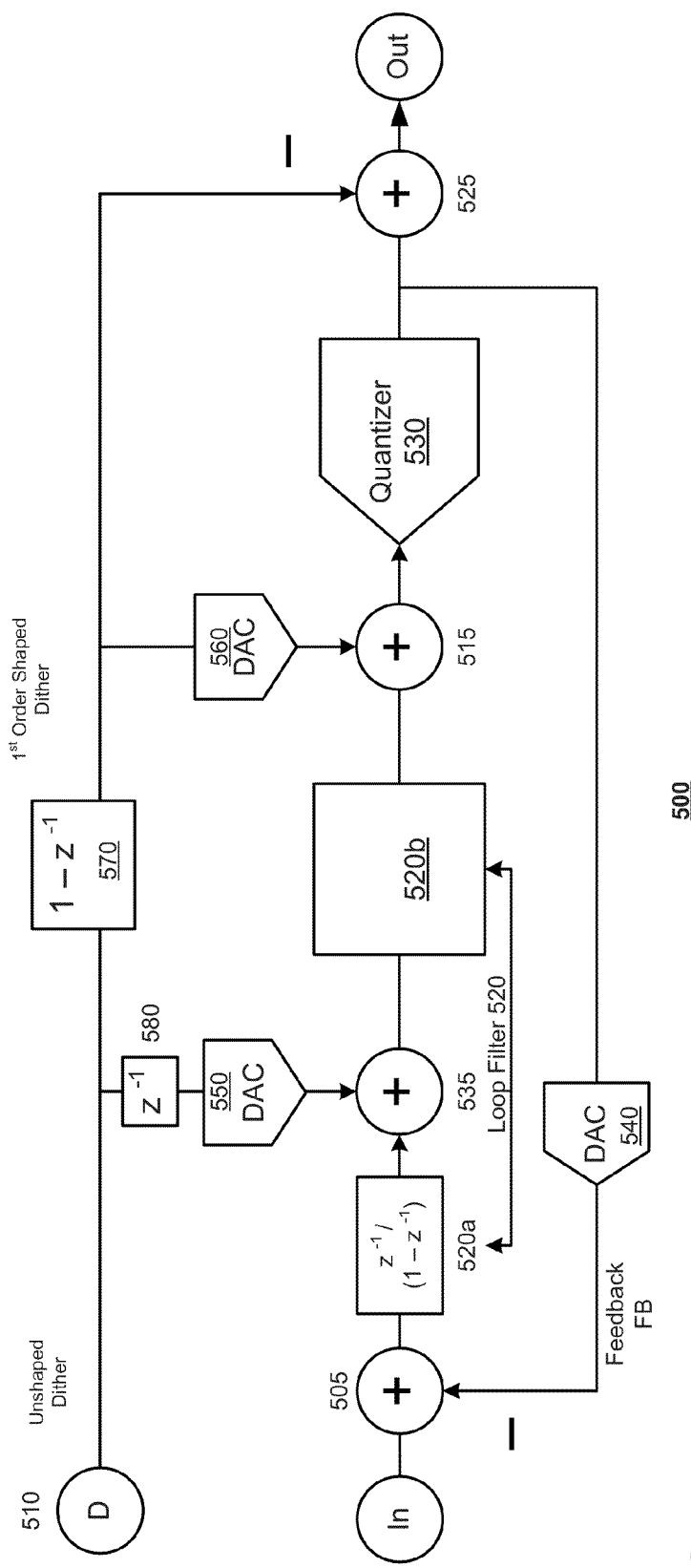
FIG. 5 illustrates a sigma delta modulator according to an embodiment of the present invention.

FIG. 5 illustrates a sigma delta modulator 500 according to another embodiment of the present invention. The sigma delta modulator 500 may include a first subtractor 505, a dither source 510, a first adder 515, a loop filter comprised of first integrator 520a and a second portion 520b, which may include a cascade of integrators or resonators, a second subtractor 525, a quantizer 530, a second adder 535, a variety of DACs 540-560, a shaping unit 570 and a delay unit 580. The modulator 500 may accept an input signal IN at an input of the first subtractor 505 and may generate an output signal OUT at an output terminal of the second subtractor 525. The first subtractor 505 may generate an output signal representing a difference between an analog input signal IN and an analog representation of the quantizer 530 digital output, generated by the DAC 540.

In the embodiment illustrated in FIG. 5, the dither source 510 may generate a dither signal D that is input to the modulator 500 as a digital signal. Again, in an embodiment, the dither signal D may initially be unshaped, but be later shaped, for example, by shaping unit 570. Shaping unit 570 may be digital process stage filters that shape the dither according to a function, such as $1-z^{-1}$. The DACs 550 and 560 may generate analog representations of the unshaped and shaped dither signal, respectively, which may be input respectively to the first adder 535 and the second adder 515.

In the embodiment illustrated in FIG. 5, the introduction of shaped dither after the loop filter 520a-b at adder 515 (and removal of the dither at subtractor 525 and adder 535 through DAC 550) may obviate the need for additional headroom to compensate for the dither at loop filter 520a-b. In the embodiment of FIG. 5, shaped dither may be removed at the output of the first integrator output rather than at its input, as in the embodiment of FIG. 4. As the first order differentiated dither $-(1-z^{-1})$ D is processed by delaying integrator 520a with transfer function $z^{-1}/(1-z^{-1})$, a dither component $-z^{-1}$D results at the output of integrator 520a. The minus sign is introduced by subtractor 505. Delay unit 580 and DAC 550 may remove that dither component by adding a cancelling dither component $z^{-1}$D. Since dither is canceled prior to reaching the loop filter 520b, no additional headroom may be needed at the loop filter 520b due to the introduction of dither. Integrator 520a may need additional headroom to process dither. However, this may not be the case in a practical implementation, as described in the following. The accuracy of dither DAC 550 is relaxed, since it introduces a canceling dither component at the output of first integrator 520a. Any error introduced at the output of first integrator 520a, may be shaped by a first order function when referred to the input.

The first subtractor 505 may have inputs for the input signal IN and a feedback signal FB generated by a DAC 540 in a feedback path of the modulator 500. The first subtractor 505 may generate an output that represents a difference between the input signal and the output signal QOUT of the quantizer (e.g., ΔIN=IN−QOUT). The output signal ΔIN from the first subtractor 505 may be input to a loop filter, including 520a and 520b, which may be a low pass filter. Since dither is added after the loop filter and removed at the quantizer output, no additional headroom is needed within loop filter 520a-b due to the introduction of dither. The dither may be removed at the output of integrator 520a and hence integrator 520a may appear to require extra headroom. However, in switch capacitor implementations, integrator 520a and adder 535 can be merged into a common circuit, as described below with respect to FIG. 6 and FIG. 7, and only the output of adder 535 can be made physically accessible. Thus, no extra headroom for integrator 520a may be required.

The output of the loop filter 520a-b may be input to the adder 515, along with an analog representation of the shaped dither signal. The adder 515 may add the shaped dither signal into the loop filter's output, which may be input to the quantizer 530. The quantizer 530 may generate a digital representation of the signal input to it from the subtractor 525. Therefore, the output of the quantizer 530 includes a shaped dither component.

The second subtractor 525 may subtract the shaped dither signal D $(1-z^{-1})$ from the output of the quantizer 530, which effectively cancels the dither component in the output of the quantizer. An output of the second subtractor 525 may be output from the modulator 500 as the output signal OUT.

In the embodiment illustrated in FIG. 5, the DAC 540 in the feedback path takes its input from the output for the quantizer 530, which as noted, includes a shaped dither component. The DAC 540 may generate an analog representation of the digital signal presented to it and, therefore, may generate a feedback signal. The quantizer 530 may be a scalar or rounding quantizer used to perform quantization on an input signal. The quantizer 530 may be situated between adder 515 and subtractor 525. As discussed above, dither may be introduced at adder 515 and removed at subtractor 525 and adder 535. In addition, the dither DAC 550 is used to remove dither from the feedback loop. In this manner, dither may be used by the quantizer 530 to break potential tonal behavior exhibited due to quantization noise produced by the quantizer 530 without adding additional headroom to compensate for the dither at the loop filter 520a-b.

Figure 6:
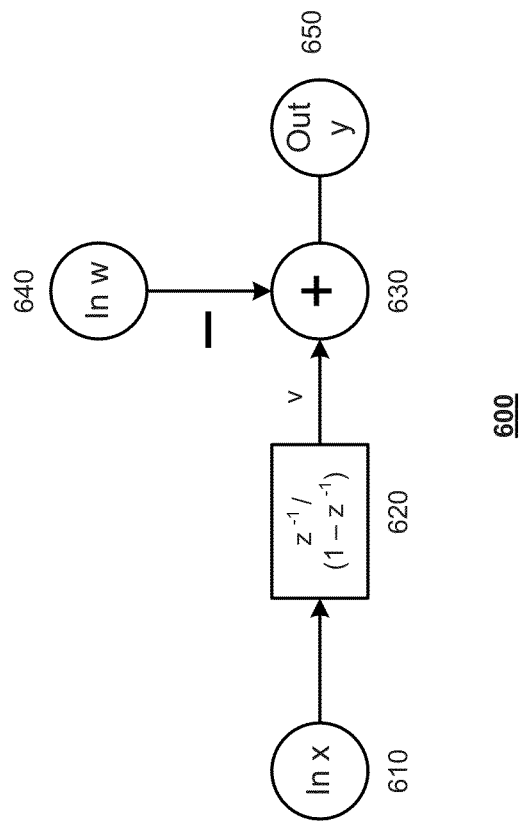
FIG. 6. illustrates a combined integrator/adder according to an embodiment of the present invention.

FIG. 6 is a combined integrator/adder 600 according to an embodiment of the present invention. For example, integrator 520a and adder 535 from FIG. 5 may be combined according to embodiments of the present invention. Combining the integrator and adder results in only a combined output, which may obviate the need for additional headroom in the integrator due to the addition of dither. The combined integrator/adder 600 may include:

As illustrated within FIG. 6, combined integrator/adder 600 may include integrator 620 and subtractor 630. Integrator 620 may accept input x 610. The integrator 620 may apply a z domain transfer function, such as $z^{-1}/(1-z^{-1})$, for example. Subtractor 630 combines an input w 640 with the output of integrator 620, v, to produce output y 650.

Figure 7:
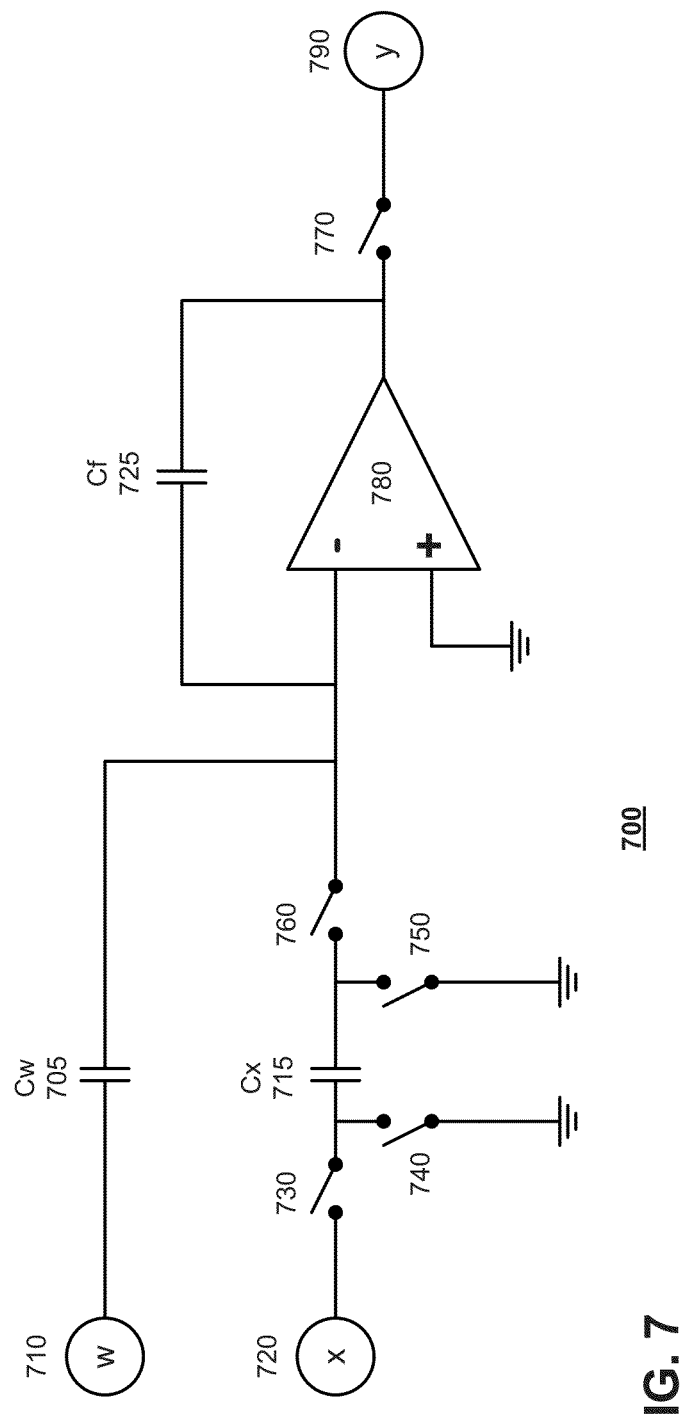
FIG. 7 illustrates a combined integrator/adder according to an embodiment of the present invention.

FIG. 7 is a switched-capacitor implementation of a combined integrator/adder according to an embodiment of the present invention. For example, integrator 520a and adder 535 from FIG. 5 may be combined according to embodiments of the present invention, such as illustrated within FIG. 6 above. The combined integrator/adder of FIG. 6 may be implemented using a switched-capacitor implementation, such as that illustrated within FIG. 7. Using such an implementation may avoid the need for additional headroom in the integrator when dither is added.

In the embodiment illustrated in FIG. 7, the switched-capacitor implementation of a combined integrator adder 700 may include switches 730, 740, 750, 760 and 770 and capacitors Cw 705, Cx 715 and Cf 725. The switches 730, 740, 750, 760 and 770 may be driven by standard non-overlapping clocks, with switches 730, 750 and 770 comprising a first group and switches 740 and 760 comprising a second group. When the first group is on and the second group is off, capacitor Cx 715 may be charged to voltage input x 720. When the first group turns off and the second group remains off, the input x 720 voltage may be sampled on Cx 715. When the second group is on and the first group is off, charge from Cx

715 may be transferred to Cf 725 on top of the previous charge, thus performing an integrating function. If a voltage is applied to the w input, it appears at the output scaled by Cw/Cf. In summary, this circuit may implement a transfer function of the type:

$$y = Cx/Cf z^{-1}/(1-z^{-1})x + Cw/Cf w$$

Figure 8:
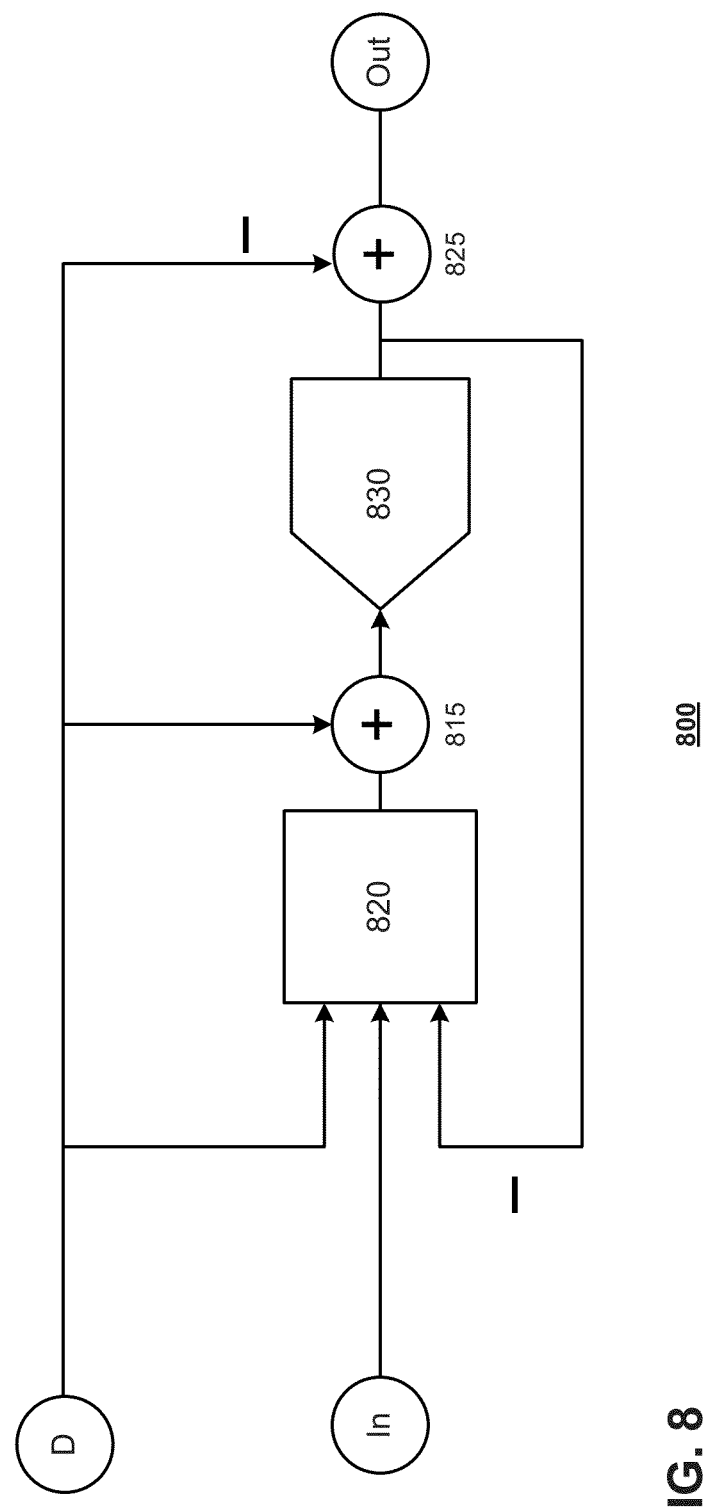
FIG. 8 illustrates a sigma delta modulator according to an embodiment of the present invention.

FIG. 8 illustrates a sigma delta modulator 800 according to an embodiment of the present invention. The sigma delta modulator 800 may include an adder 815, a loop filter 820, a subtractor 825, a quantizer 830. The loop filter 820 may be a low-pass filter, a band pass filter, or high pass filter.

The dither source may introduce a dither signal to the input, which may be introduced to the loop filter 820 at any of the illustrated points. The input may be directly introduced to the loop filter 820, or may be introduced through a summing junction, as illustrated in embodiments above. The dither signal may be applied to an output of the loop filter 820 via the adder 815. In an embodiment, the dither signal may be shaped as discussed above with respect to FIGS. 4 and 5.

The quantizer 830 may quantize the input signal and output it to the subtractor 825. The subtractor 825 may subtract the dither signal from the output of the quantizer 830. In an embodiment, the quantizer 830 may be a scalar or rounding quantizer. The output of the subtractor 825 may be output from the system 800 as the system's output signal OUT. Further, a feedback loop may introduce the output of quantizer 830 to loop filter 820.

As discussed above, the dither signal may be introduced at adder 815 and removed at the subtractor 825. In this manner, dither may be used by the quantizer 830 to break potential tonal behavior that otherwise might occur due to quantization noise produced by the quantizer 830. At the same time, by removing the dither in loop filter 820, the dither does not require additional headroom to be provided within the loop filter 820 to accommodate the dither signal. Thus, by introducing the dither signal at a point after the loop filter 820 but before the quantizer 830 and, further, by removing the dither signal in loop filter 820, the embodiment of FIG. 8 provides a straightforward and low cost solution to the headroom problems typically associated with adding dither.

Figure 9:
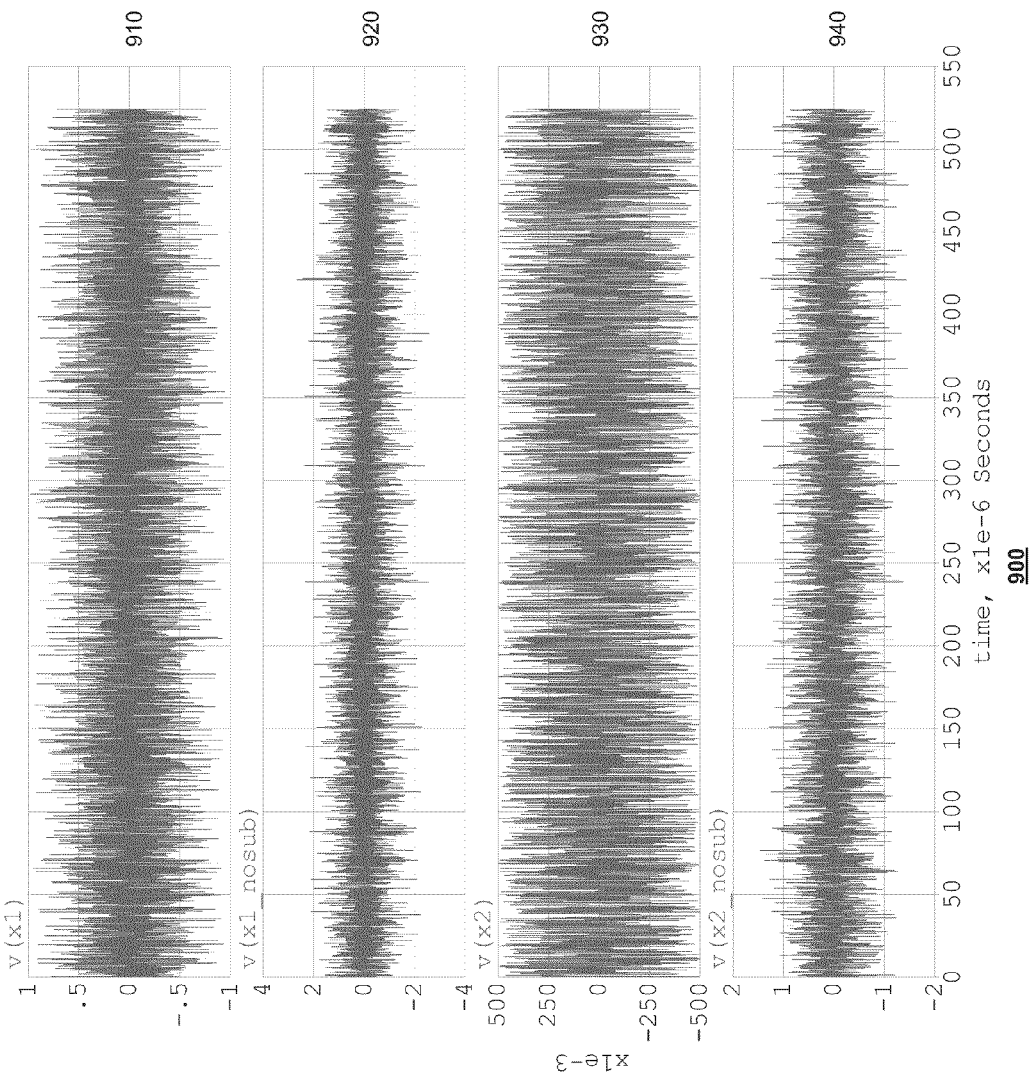
FIG. 9 illustrates a series of graphs representing integrator swings using standard dither and subtractive dither.

FIG. 9 illustrates a series of graphs representing integrator swings using standard dither and subtractive dither. These graphs represent exemplary results using embodiments of the present invention. As illustrated by graphs 910 and 930, swings can be significantly reduced using subtractive dither techniques. Graphs 920 and 940 represent swings when not using subtractive dither techniques. As illustrated, swings can be significantly reduced when using subtractive dither.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A sigma delta modulator comprising:
a loop filter;
an adder configured to accept an output of the loop filter and a dither input signal, and to combine the output of the loop filter and the dither input signal into a combined output signal;
a quantizer configured to accept the combined output signal from the adder, and quantize the combined signal into a quantizer output signal;
a first subtractor configured to accept the quantizer output signal and subtract the dither input signal from the quantizer output signal;
a first digital-to-analog converter configured to accept an output from the first subtractor via a feedback path of the sigma delta modulator, and to convert the output from the first subtractor into an analog signal; and
a second subtractor configured to accept the analog signal from the first digital-to-analog converter, and output to the loop filter a signal representing the difference of an input signal and the analog signal.

2. A sigma delta modulator comprising:
a loop filter;
an adder configured to accept an output of the loop filter and a dither input signal, and to combine the output of the loop filter and the dither input signal into a combined output signal;
a quantizer configured to accept the combined output signal from the adder, and quantize the combined signal into a quantizer output signal;
a first subtractor configured to accept the quantizer output signal and subtract the dither input signal from the quantizer output signal;
a first digital-to-analog converter configured to accept an output from the quantizer and to convert the output from the quantizer into an analog signal;
a second subtractor configured to accept the analog signal from the first digital-to-analog converter, and output to the loop filter a signal representing the difference of an input signal and the analog signal;
a second digital-to-analog converter configured to accept the dither input signal and provide a first output signal to the second subtractor; and
a third digital-to-analog converter configured to accept the dither input signal and provide a second input to the adder.

3. The sigma delta modulator of claim 1, wherein the dither input signal comprises unshaped dither.

4. The sigma delta modulator of claim 1, wherein the dither input signal is a shaped dither signal.

5. A sigma delta modulator comprising:
a loop filter;
an adder configured to accept an output of the loop filter and a dither input signal, and to combine the output of the loop filter and the dither input signal into a combined output signal;
a quantizer configured to accept the combined output signal from the adder, and quantize the combined signal into a quantizer output signal;
a first subtractor configured to accept the quantizer output signal and subtract the dither input signal from the quantizer output signal;
wherein the dither input signal is a shaped dither input signal, being shaped by a transfer function $(1-z^{-1})$.

6. The sigma delta modulator of claim 1, wherein the quantizer is a scalar quantizer.

7. The sigma delta modulator of claim 1, wherein the quantizer is a rounding quantizer.

8. The sigma delta modulator of claim 1, wherein the loop filter is a low-pass filter.

9. A sigma delta modulator comprising:
a loop filter comprising a first unit and a second unit, the first unit including a combined integrator/adder;

a first adder configured to accept an output of the loop filter and a dither input signal, and to combine the output of the loop filter and the dither input signal into a combined output signal;

a quantizer configured to accept the combined output signal from the first adder, and quantize the combined signal into a quantizer output signal;

a first subtractor configured to accept the quantizer output signal and subtract the dither input signal from the quantizer output signal;

a first digital-to-analog converter configured to accept an output from the quantizer via a feedback path of the sigma delta modulator, and to convert the output from the quantizer into an analog signal; and a second subtractor configured to accept the analog signal from the first digital-to-analog converter, and output to the loop filter a signal representing the difference of an input signal and the analog signal.

10. The sigma delta modulator of claim 9, further comprising:

a first dither shaping unit configured to shape the dither input signal to produce a first order shaped dither signal;

a second digital-to-analog converter configured to accept the first order shaped dither signal and provide a first output signal to the first adder;

a delay unit configured to delay the dither input signal to produce a delayed dither signal;

a third digital-to-analog converter configured to accept the delayed dither signal and provide an output to a second adder of the first unit of the loop filter, the first unit including a combined integrator/adder.

11. The sigma delta modulator of claim 10, wherein the first order dither shaping unit is configured to perform the function $(1-z^{-1})$.

12. The sigma delta modulator of claim 10, wherein the delay unit is configured to perform the function $(z^{-1})$.

13. A sigma delta modulator comprising:

a loop filter comprising a first unit and a second unit, the first unit including a combined integrator/adder;

a first adder configured to accept an output of the loop filter and a dither input signal, and to combine the output of the loop filter and the dither input signal into a combined output signal;

a quantizer configured to accept the combined output signal from the first adder, and quantize the combined signal into a quantizer output signal; and a first subtractor configured to accept the quantizer output signal and subtract the dither input signal from the quantizer output signal;

wherein the combined integrator/adder includes an integrator and a subtractor configured to combine an input with an output of the integrator.

14. The sigma delta modulator of claim 9, wherein the combined integrator/adder comprises:

a first group of switches;
a second group of switches;
a first capacitor; and
a second capacitor.

15. The sigma delta modulator of claim 14, wherein when the first group of switches is on and the second group of switches is off, the first capacitor is charged to a voltage input.

16. The sigma delta modulator of claim 15, wherein when the first group of switches turns off and the second group of switches is off, the voltage input may be sampled on the first capacitor.

17. The sigma delta modulator of claim 16, wherein when the first group of switches is off and the second group of switches is on, a charge from the first capacitor is transferred to the second capacitor.

18. A method for sigma delta modulation comprising:

accepting an output of a loop filter and a dither input signal by an adder;

combining the output of the loop filter and the dither input signal into a combined output signal;

accepting the combined output signal from the adder by a quantizer;

quantizing the combined signal into a quantizer output signal;

accepting the quantizer output signal by a first subtractor;

subtracting the dither input signal from the quantizer output signal by the first substractor;

accepting an output from the first subtractor via a feedback path, and converting the output from the first subtractor into an analog signal; and accepting the analog signal by a second subtractor, and outputting to the loop filter a signal representing the difference of an input signal and the analog signal.

19. A method for sigma delta modulation comprising:

accepting an output of a loop filter and a dither input signal by an adder;

combining the output of the loop filter and the dither input signal into a combined output signal;

accepting the combined output signal from the adder by a quantizer;

quantizing the combined signal into a quantizer output signal;

accepting the quantizer output signal by a first subtractor of a decimation filter;

subtracting the dither input signal from the quantizer output signal by the first substractor of the decimation filter;

accepting an output from the quantizer via a feedback path, and converting the output from the quantizer into an analog signal; and accepting the analog signal by a second subtractor, and outputting to the loop filter a signal representing the difference of an input signal and the analog signal.

20. A sigma delta modulator comprising:

a loop filter;

an adder, situated before a last integrator of the loop filter, configured to accept a signal of the loop filter and a dither input signal, and to combine the signal of the loop filter and the dither input signal into a combined signal;

a quantizer configured to accept the combined signal from the adder and loop filter, and quantize the combined signal into a quantizer output signal;

a first subtractor configured to accept the quantizer output signal and subtract the dither input signal from the quantizer output signal;

a first digital-to-analog converter configured to accept an output from the first subtractor via a feedback path of the sigma delta modulator, and to convert the output from the first subtractor into an analog signal; and a second subtractor configured to accept the analog signal from the first digital-to-analog converter, and output to the loop filter a signal representing the difference of an input signal and the analog signal.

21. The sigma delta modulator of claim 20, wherein the last integrator of the loop filter implements a z-domain transfer function given by $1/(1-z^{-1})$.

22. The sigma delta modulator of claim 20, wherein the dither input signal accepted by the adder is a shaped dither input signal.

23. The sigma delta modulator of claim 22, wherein the shaped dither input signal is shaped by a transfer function $(1-z^{-1})$.

24. The sigma delta modulator of claim 13, wherein the integrator implements a z-domain transfer function given by $z^{-1}/(1-z^{-1})$.

* * * * *

UNITED STATES PATENT AND TRADEMARK OFFICE
CERTIFICATE OF CORRECTION

PATENT NO.        : 8,766,836 B2
APPLICATION NO.   : 13/715005
DATED             : July 1, 2014
INVENTOR(S)       : Roberto S. Maurino et al.

Page 1 of 1

It is certified that error appears in the above-identified patent and that said Letters Patent is hereby corrected as shown below:

Title page, Item "(71) Applicants", please change:

"Roberto S. Maurino, Turin (IT); Colin G. Lyden, Torino (IE)" to -- Roberto S. Maurino, Torino (IT); Colin G. Lyden, Baltimore (IE) --;

Title page, Item "(72) Inventors", please change:

"Roberto S. Maurino, Turin (IT); Colin G. Lyden, Torino (IE)" to -- Roberto S. Maurino, Torino (IT); Colin G. Lyden, Baltimore (IE) --.

Signed and Sealed this
Thirteenth Day of January, 2015

Michelle K. Lee
*Deputy Director of the United States Patent and Trademark Office*